United States Patent [19]
Nakamori

[11] Patent Number: 5,359,223
[45] Date of Patent: Oct. 25, 1994

[54] LEAD FRAME USED FOR SEMICONDUCTOR INTEGRATED CIRCUITS AND METHOD OF TAPE CARRIER BONDING OF LEAD FRAMES

[75] Inventor: Susumu Nakamori, Tokyo, Japan

[73] Assignee: NEC Corporation, Japan

[21] Appl. No.: 947,266

[22] Filed: Sep. 18, 1992

[30] Foreign Application Priority Data

Sep. 19, 1991 [JP] Japan ................. 3-238527

[51] Int. Cl.5 .............. H01L 23/48; H01L 29/44; H01L 29/52; H01L 29/60
[52] U.S. Cl. ............................ 257/666; 257/673
[58] Field of Search ............... 257/673, 780, 781, 784, 257/785, 666; 437/217, 220, 222; 228/179.1, 180.2, 169, 3.1

[56] References Cited

U.S. PATENT DOCUMENTS

| | | | |
|---|---|---|---|
| 3,347,442 | 10/1967 | Reber | 257/784 |
| 3,832,769 | 9/1974 | Olyphant, Jr. et al. | 257/700 |
| 3,868,724 | 2/1975 | Perrino | 257/668 |
| 4,771,330 | 9/1988 | Long | 257/667 |
| 4,980,753 | 12/1990 | Dunaway et al. | 257/666 |

FOREIGN PATENT DOCUMENTS 63-42156  2/1988  Japan .................. 257/676

Primary Examiner—Sara W. Crane
Assistant Examiner—S. V. Clark
Attorney, Agent, or Firm—Laff, Whitesel, Conte & Saret

[57] ABSTRACT

There is provided a lead frame structure used in a semiconductor device which is fabricated by a tape carrier bonding method. The lead frame structure has a convex portion at its top portion which is subjected to a thermal compression with a bonding tool. The convex portion may be formed by bending the top portion of the lead frame toward the bonding tool side up to an angle of at least approximately 90 degrees. When the bonding tool compresses the top portion of the lead frame, the bent portion is compressed and deformed but no damage of the lead frame thereby preventing formations of a depression region and a rapid drop portion in the lead frame, which is defined by an edge of the bonding tool in which the rapid drop portion is likely to cause disconnection of the lead frame during or after the bonding process. The invention permits the lead frame to be free from disconnection by a thermal compression with the bonding tool.

11 Claims, 3 Drawing Sheets

| # LEAD FRAME USED FOR SEMICONDUCTOR INTEGRATED CIRCUITS AND METHOD OF TAPE CARRIER BONDING OF LEAD FRAMES

BACKGROUND OF THE INVENTION

The invention relates to a lead frame used for semiconductor integrated circuits and its bonding method, and more particularly to a lead frame structure suitable for a thermal compression bonding in a tape carrier method used for fabrication processes of semiconductor integrated circuits.

A tape carrier method has widely been used for fabrication of semiconductor integrated circuits because the method is suitable for automatic bonding of lead frames. In the tape carrier bonding method, lead contacts having a conductivity are formed on a flexible film made of an insulator such as a polyimide based resin. Generally, such lead frames are directly bonded to bumps of semiconductor devices by use of a thermal compression method.

The tape carrier bonding method as prior arts will subsequently be described with reference to FIG. 1. A film 1 comprising a homogeneous flexible tape, which is made of an insulator material such as polyimide is prepared. The film 1 is provided at its opposite sides with a plurality of sprocket holes 2 at regular intervals and provided at its center portion with device holes 4. Subsequently, lead patterns are formed on the film 1 by using a method such as metal etching, or corrosion so that a top portion 3A of each of lead contacts 3 of the lead patterns protrudes into the device hole 4 thereby permitting the top portion 3A of the lead contacts 3 to be bonded to bumps of a semiconductor device 5 such as IC chips by using a thermal compression. The each lead contact also has an opposite end to the top portion 3A, which serves as a contact portion 3C by which a measurement of electric characteristics of the semiconductor device is accomplished by contacting a probe with the contact portion 3C.

The film 1 is provided at its opposite sides with a pluraity of the sprocket holes at regular intervals so that the sprocket holes may be engaged with tooth gears having the same pitch as the sprocket holes and automatically transmitted with the teeth gears. Such lead patterns are arranged on the film 1 at regular intervals thereby permitting automatic bonding which will subsequently be described with reference to FIG. 2.

A bonding process of the lead frame and the semiconductor deice is accomplished as follows. The top portion 3A of the lead contact 3 are arranged so as to overlay a bump on the semiconductor device 5, after which the top portion 3A is pressed down with a heating element 6 serving as a bonding tool so that the top portion 3A is bonded with the semiconductor device 5 through the bump 5A. Such prior arts are, however, engaged with following disadvantages. Such pressure welding with using the heating element 6 serving as the bonding tool forms a depressed area in the top portion of the lead frame thereby forming a sharp drop portion 3D in the lead frame, which is defined by an edge portion of the heating element 6 of the bonding tool. The sharp drop portion 3D of the lead frame is likely to cause cracks during or after the bonding process to the device. The lead frame may readily be cut due to extremely weakness in strength of the sharp drop portion 3D.

SUMMARY OF THE INVENTION

Accordingly, it is a primary object of the present invention to provide a novel lead frame structure suitable for a thermal compression bonding in a tape carrier method.

It is another object of the present invention to provide an improved bonding method of lead frames and a semiconductor device, which permits preventing lead frame disconnection during or after a thermal compression bonding.

The above and other objects, features and disadvantages of the present invention will be apparent from following descriptions.

There is provided a novel lead frame structure which has at least a convex portion at its top portion subjected to a thermal compression with a bonding tool in the tape carrier bonding method. The convex portion formed at the top portion of the each lead frame permits preventing a formation of a depression region and a drop portion in the lead frames, while the top portion having the convex portion is compressed with the bonding tool. The convex portion may be formed by various methods such as bending of the lead frame. Preferably, the top portion of the lead frame is bent toward the bonding tool side at least up to an angle of approximately 90 degrees. The top portion may also be bent up to an angle of 180 degrees toward the bonding tool side so that the the top portion overlays the lead frame. It is also available to bend the top portion of the lead frame in the range of bending angle from approximately 90 degrees to 180 degrees toward the bonding tool side. In replacement of the bending, it is available to form an expanded portion at the top of the lead frame. When the thermal compression bonding of the lead frames and the semiconductor device is accomplished with the heating body serving as the bonding tool, a convex portion such as a bent portion or an expanded portion of the lead frame is compressed thereby resulting in a deformation of the convex portion but no deformation of the lead frame. This permits preventing the depression area and the drop portion to be formed in the lead frame as well as the lead frame to be cut.

BRIEF DESCRIPTION OF THE DRAWINGS

Preferred embodiments of the present invention will hereinafter fully be described in detail with reference to the accompanying drawings.

PREFERRED EMBODIMENTS OF THE INVENTION

There is provided a novel lead frame structure which has at least a convex portion at its top portion which is subjected to a thermal compression with a heat bonding tool in the tape carrier bonding method. The convex portion formed at the top portion of the lead frame permits preventing a depression region and a drop portion to be formed in the lead frame, while the top portion having the convex portion is compressed with the bonding tool. The convex portion may be formed by various methods such as bending of the lead frame.

In the tape carrier bonding process, lead contact patterns are formed on a flexible film tape made of an insulating material such as a polyimide based resin by normal processes such as a metal etching method so that a top portion of each lead contact is protruded into a device hole formed in the film tape.

Figure 1:
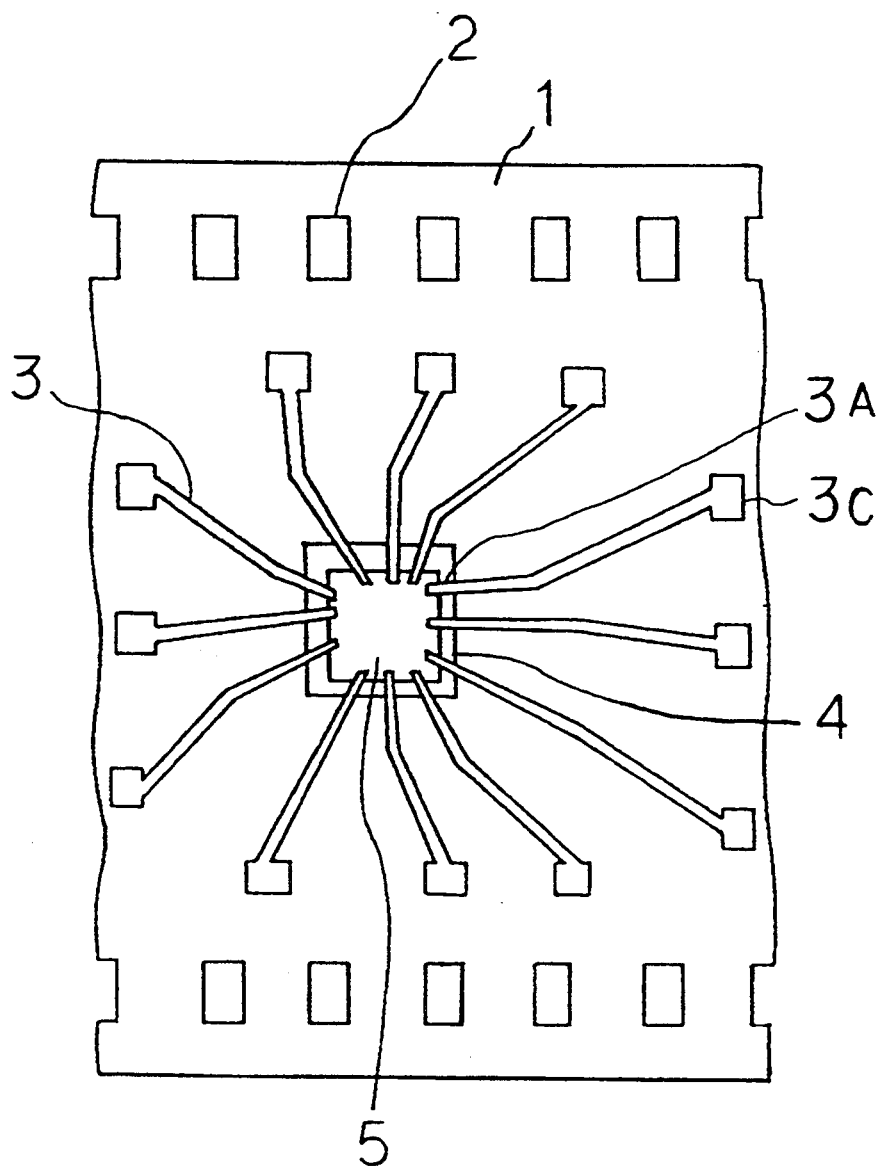
FIG. 1 is a fragmentary plane view illustrative of a flexible film tape including the conventional lead frames prior to a thermal compression bonding of lead frames and semiconductor devices with a heat bonding tool in a tape carrier method.
Figure 2:
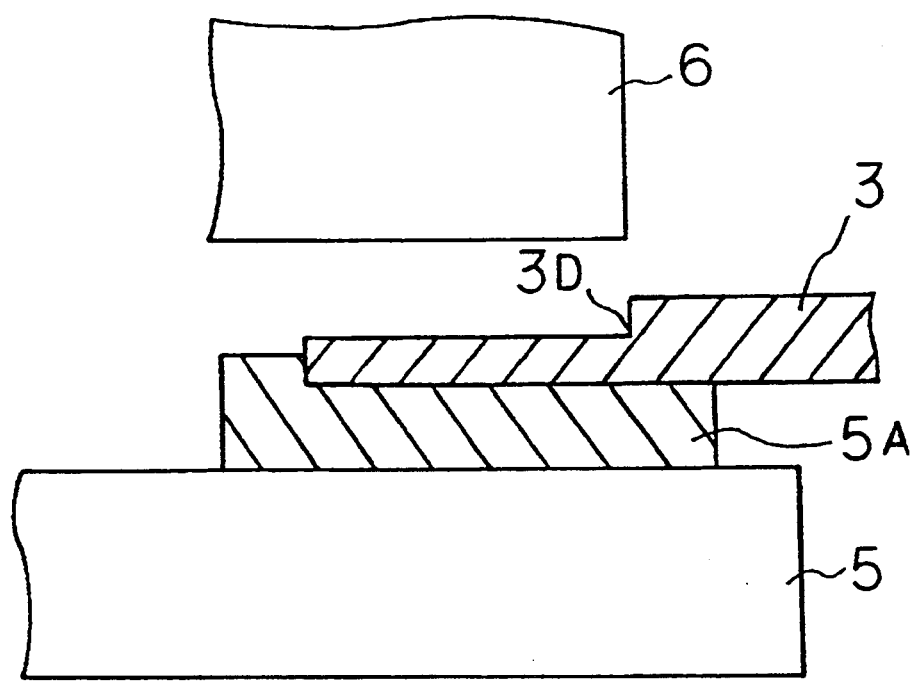
FIG. 2 is a fragmentary cross sectional elevation view illustrative of the conventional lead frame compressed with a heat bonding tool and bonded to the semiconductor device through a bump in a tape carrier bonding method.
Figure 3:
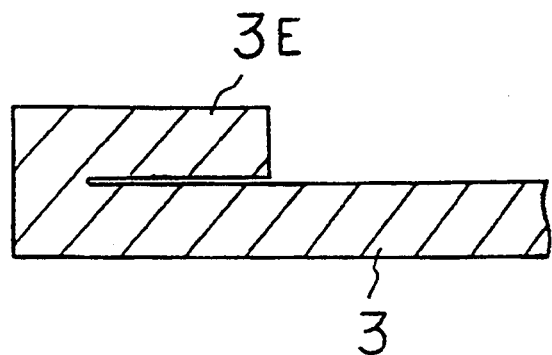
FIG. 3 is a fragmentary cross sectional elevation view illustrative of one embodiment of a novel lead frame structure having a bent portion according to the present invention.

With reference to FIG. 3, the lead contact top portion having a length of approximately 100 micrometers is subsequently bent up to an angle of approximately 180 degrees so that a bent top portion 3E overlays the lead contact 3.

Figure 4:
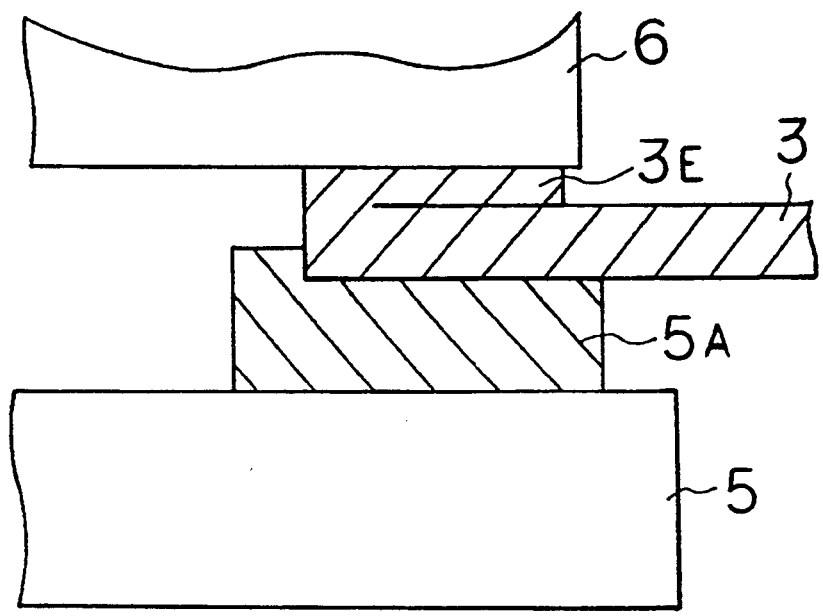
FIG. 4 is a fragmentary cross sectional elevation view illustrative of a lead frame compressed with a heat bonding tool and bonded to a semiconductor device through a bump in one embodiment according to the present invention.

With reference to FIG. 4, the bent portion 3E (called an "expanded portion") of the lead contact 3 is so arranged as to overlay a bump 5A of a semiconductor device 5, after which the thermal compression bonding of the lead frame and the semiconductor device 5 through the bump is accomplished with a heating body 6 which serves as a bonding tool. The heating body 6 serving as the bonding tool compresses the bent portion 3E at a predetermined pressure. As a result of this compression, the bent portion 3E of the lead contact 3 is compressed thereby resulting in a deformation of the bent portion 3E, but no damage of the lead contact 3. The lead contact 3 is securely bonded to the semiconductor device 5 through the bump 5A. This prevents a depression area and a drop portion to be formed in the lead contact 3, which tends to cause the lead contact 3 to be disconnected during or after the bonding.

Figure 5:
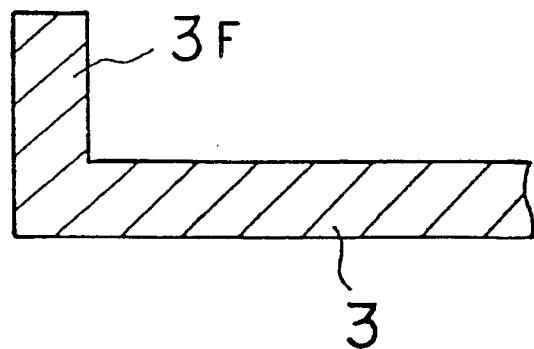
FIG. 5 is a fragmentary cross sectional elevation view illustrative of another embodiment of a novel lead frame structure having a bent portion according to the present invention.

Another embodiment will subsequently be described with reference to FIG. 5. A lead contact top portion having a length of approximately 50 micrometers may be bent toward the heating body serving as the bonding tool up to an angle of approximately 90 degrees so that an upright bent portion 3F (called an "expanded portion") is formed. After this bending, the heating body serving as the bonding tool compresses the bent portion 3F of the lead contact 3 at a predetermined pressure so that the upright bent portion 3F is compressed and deformed except the lead contact 3. The lead contact 3 may be bonded to the semiconductor device through the bump. The upright bent portion 3F prevents the lead contact 3 to be formed with a depression area and a rapid drop portion defined by an edge of the heating body. The upright bent portion 3F of the lead frame 3 is readily formed as compared with lead frame which is bent at 180 degrees in the above embodiment.

It is no doubt available to bend the top portion of the lead frame in the range of the bending angle from approximately 90 degrees to 180 degrees. While the bending angle of at least 90 degrees is preferable, a less angle banding of the lead contact is available if a bent portion permits preventing the lead contact to be formed with a depression and a sharp drop portion defined by the edge portion of the heating body serving as the bonding tool during the thermal compression bonding. This permits preventing the lead contact to be disconnected during or after the bonding process. The angle and the length of the bent portion may be varied so as to match variable conditions.

In replacement of the bending, it is available to form an expanded portion at the top of the lead contact, while the structure is not illustrated in the drawings. The heating body serving as the bonding tool compresses the expanded portion of the lead contact so that the expanded portion is compressed and deformed but no damage of the lead frame. The lead contact may be bonded to the semiconductor device through the bump. The expanded portion permits preventing the lead contact to be formed with a depression area and a rapid drop portion defined by an edge of the heating body.

In the present invention, the convex portion such as a bent portion is formed at the top portion of the lead frame which will be compressed with the bonding tool in the tape carrier bonding method so that the convex portion except the lead frame is subjected to damage by bonding tool thereby preventing a depression area and a rapid drop portion to be formed in the lead frame. Such lead frames without depression area and drop portion are free from disconnection thereof during or after the bonding process. From the set forth descriptions, it is off course understood that the novel lead frame structure and the method according to the present invention may be applied to the thermal compression bonding of lead frames such as a tape carrier bonding method suitable for fabrication processes of a variety of semiconductor devices.

Whereas modifications of the present invention will no doubt be apparent to a person of ordinary skilled in the art, it is to be understood that the embodiments shown and described by way of illustration are by no means intended to be considered in a limiting sense. Accordingly, it is to be intended by the claims to cover all modifications of the invention which fall within the spirit and scope of the invention.

What is claimed is:

1. A lead frame structure used in connection with a type of semiconductor devices (5) which are fabricated by a tape carrier (1) bonding method, said lead frame comprising at least one contact lead (3) which has an end portion (3E, 3F) that is bent to become thicker than the rest of the contact lead in order to form a convex portion at a top side of said contact lead, said convex portion being positioned to be subjected to compression by a bonding tool (6), said convex portion comprises said bent portion (3E, 3F) formed by said contact lead being bent back toward said bonding tool (6) at an angle of at least approximately 90 degrees, whereby said bent portion prevents a depression area from being formed in said lead upon compression by said bonding tool.

2. A lead frame structure as claimed in claim 1, wherein said bending angle of said bent portion to said contact lead is approximately 90 degrees so as to form an upright bent portion.

3. A lead frame structure as claimed in claim 1, wherein said bending angle of said bent portion to said contact lead is approximately 180 degrees so as to overlay said contact lead.

4. A lead frame structure as claimed in claim 1, wherein said bending angle of said bent portion to said contact lead is more than approximately 90 degrees and less than approximately 180 degrees.

5. A tape film for use in a tape carrier bonding method for fabricating semiconductor devices, said film comprising:
an insulator tape film (1) having at least a plurality of device holes formed therein; and
a plurality of lead frame conductive contacts (3) formed around each of said device holes, a top portion of each of said lead frame contacts protruding into said device hole, said top portion including an enlarged convex portion (3E, 3F) located at a position which will be subjected to compression by a bonding tool (6), said convex portion comprising a bent portion (3E, 3F) in which said lead contact is bent toward the side of said contact which is engaged by a bonding tool (6), said bend being an angle relative to said lead frame of at least approximately 90 degrees, said bending angle of said bent portion to said lead frame being approximately 90 degrees so as to form an upright bent portion, whereby said bent portion prevents a depression area from being formed in said lead frame contacts upon compression by said bonding tool.

6. A tape film as claimed in claim 4, wherein said bending angle of said bent portion to said contact lead is approximately 180 degrees so as to overlay said contact lead.

7. A tape film as claimed in claim 4, wherein said bending angle of said bent portion to said contact lead is more than approximately 90 degrees and less than approximately 180 degrees.

8. A semiconductor device of a type which is fabricated by a tape carrier bonding method, said semiconductor device comprising:
a semiconductor integrated circuit chip (5), formed on a substrate; and
a contact lead (3) bonded to said semiconductor integrated circuit chip through bumps (5A) formed on said substrate, said bonding being formed by a thermal compression applied by a heat bonding tool (6),
a convex portion (3E, 3F) formed at a top portion of each contact lead, said convex portions of said contact lead being at locations which are subjected to said thermal compression by said heat bonding tool (6), said convex portion comprising a bent portion (3E, 3F) in said contact lead which is formed by bending an end portion of said contact lead to engage said bonding tool (6) at an angle relative to said contact lead of at least approximately 90 degrees, whereby said bent portion prevents a depression area from being formed in said contact lead upon compression by said bonding tool.

9. A semiconductor device as claimed in claim 4, wherein said bending angle of said bent portion to said contact lead is approximately 90 degrees so as to form an upright bent portion.

10. A semiconductor device as claimed in claim 4, wherein said bending angle of said bent portion to said contact lead is approximately 180 degrees so as to overlay said contact lead.

11. A semiconductor device as claimed in claim 4, wherein said bending angle of said bent portion to said contact lead is more than approximately 90 degrees and less than approximately 180 degrees.

* * * * *